US011269749B2

(12) United States Patent  
Citirik et al.

(10) Patent No.: US 11,269,749 B2  
(45) Date of Patent: Mar. 8, 2022

(54) SYSTEM AND METHOD FOR MONITORING HEALTH STATUS OF A GRADIENT COIL

(71) Applicant: GENERAL ELECTRIC COMPANY, Schenectady, NY (US)

(72) Inventors: Erman Citirik, Florence, SC (US); Garrett Astary, Florence, SC (US); Jean-Baptiste Mathieu, Florence, SC (US); Derek Seeber, Florence, SC (US); Namratha Reganti, Waukesha, WI (US)

(73) Assignee: General Electric Company, Schenectady, NY (US)

( * ) Notice: Subject to any disclaimer, the term of this patent is extended or adjusted under 35 U.S.C. 154(b) by 882 days.

(21) Appl. No.: 15/974,323

(22) Filed: May 8, 2018

(65) Prior Publication Data

US 2019/0347177 A1 Nov. 14, 2019

(51) Int. Cl.
| | | |
|---|---|---|
| *G01V 3/00* | (2006.01) | |
| *G06F 11/30* | (2006.01) | |
| *G01R 33/385* | (2006.01) | |
| *G01R 33/038* | (2006.01) | |
| *G06N 3/08* | (2006.01) | |

(52) U.S. Cl.
CPC ...... *G06F 11/3055* (2013.01); *G01R 33/0385* (2013.01); *G01R 33/385* (2013.01); *G01R 33/3852* (2013.01); *G01R 33/3854* (2013.01); *G06N 3/08* (2013.01)

(58) Field of Classification Search
CPC ....... G03G 15/5058; G03G 2215/0161; G03G 15/0189; G03G 2215/0158; G03G 15/0131

USPC ......................................................... 324/301  
See application file for complete search history.

(56) References Cited

U.S. PATENT DOCUMENTS

| | | | |
|---|---|---|---|
| 8,373,417 B2 | 2/2013 | Nerreter | |
| 8,373,471 B2 | 2/2013 | Kim et al. | |
| 2003/0215125 A1 | 11/2003 | Yokoi et al. | |
| 2011/0184250 A1* | 7/2011 | Schmidt | G16H 50/50 600/300 |
| 2013/0303870 A1* | 11/2013 | Satish | G01N 33/49 600/371 |

(Continued)

FOREIGN PATENT DOCUMENTS

| | | |
|---|---|---|
| JP | 2015039424 A | 3/2015 |
| WO | 2015101556 A1 | 7/2015 |
| WO | 2018019972 A1 | 2/2018 |

OTHER PUBLICATIONS

Well-Logging.pdf (Year: 2021).*

(Continued)

*Primary Examiner* — Walter L Lindsay, Jr.  
*Assistant Examiner* — Frederick Wenderoth

(57) ABSTRACT

A system for monitoring a health status of a gradient coil disposed in a magnetic resonance imaging system is provided. The system includes one or more sensors and a controller. The one or more sensors are operative to obtain one or more parameter readings of the gradient coil, wherein the one or more parameter readings include at least one of an acoustic measurement and a back electromotive force measurement. The controller is in electronic communication with the one or more sensors and operative to generate the health status based on at least one of the acoustic measurement and the back electromotive force measurement.

17 Claims, 13 Drawing Sheets

(56) References Cited

U.S. PATENT DOCUMENTS

| | | |
|---|---|---|
| 2015/0369888 A1 | 12/2015 | Calvert |
| 2016/0178713 A1 | 6/2016 | Fischer |
| 2016/0327606 A1 | 11/2016 | Van Wieringen |
| 2017/0059670 A1* | 3/2017 | Gebhardt ................ G01R 33/24 |
| 2017/0146677 A1* | 5/2017 | Song ....................... E21B 49/08 |
| 2017/0307702 A1* | 10/2017 | Kanakasabai .......... A61B 5/055 |
| 2017/0336483 A1* | 11/2017 | Cunningham ......... A61B 5/055 |

OTHER PUBLICATIONS

Bibliographic Data, English translation of Abstract for JP2015039424; obtained from Espacenet.com Aug. 11, 2020; 1 page.

PCT application PCT/US2019/031324 filed May 8, 2019; International Search Report-Written Opinion dated Aug. 29, 2019; 10 pages.

* cited by examiner

SYSTEM AND METHOD FOR MONITORING HEALTH STATUS OF A GRADIENT COIL

TECHNICAL FIELD

This disclosure relates to a system and method for monitoring a health status of a gradient coil disposed in a magnetic resonance imaging system.

DISCUSSION OF ART

Magnetic resonance imaging ("MRI") is a widely accepted and commercially available technique for obtaining digitized visual images representing the internal structure of objects having substantial populations of atomic nuclei that are susceptible to nuclear magnetic resonance ("NMR"). Many MRI systems use superconductive magnets to scan a subject/patient via imposing a strong main magnetic field on the nuclei in the subject. The nuclei are excited by a radio frequency ("RF") signal/pulse transmitted by a RF coil at characteristics NMR (Larmor) frequencies. By spatially disturbing localized magnetic fields surrounding the subject and analyzing the resulting RF responses, also referred to hereinafter as the "MR signal," from the nuclei as the excited protons relax back to their lower energy normal state, a map or image of these nuclei responses as a function of their spatial location is generated and displayed. An image of the nuclei responses, also referred to hereinafter as an "MRI image" and/or simply "image," provides a non-invasive view of a subject's internal structure.

Many MRI systems utilize large electromagnetic coils, commonly referred to as gradient coils, to generate magnetic gradient fields within a target volume containing the subject by exciting/energizing the gradient coils via an electrical current. Continued/repeated excitation of a gradient coil over an extended period of time, however, may damage the gradient coil, which in turn, may result in failure of the gradient coil, e.g., generation of degraded magnetic gradient fields and/or an inability to generate a magnetic gradient field at all. Typically, failure of a gradient coil results in unusable data from an MRI procedure/scan. As will be appreciated, many MRI procedures are often resource intensive. Thus, executing an MRI procedure/scan with an undetected failed gradient coil is often a costly event for both patients and MRI system operators, e.g., hospitals.

Due to a variety of reasons, it is often difficult and/or impossible to predict when a particular gradient coil will fail via manual inspection. For example, gradient coils can be difficult to manually inspect as they are typically located/encased in a magnet assembly. As such, manual inspection of a gradient coil typically requires the MRI system to be taken offline, i.e., out of service, which reduces the availability of the MRI system to patients. Further, manual inspection of a gradient coil may not accurately predict failure of the gradient coil as many traditional gradient coil diagnostics systems are limited in their capabilities to detect/recognize symptoms indicative of an impending failure. While automated approaches for detecting a failed gradient coil exist, many such approaches are only effective after failure of the gradient coil has occurred. Additionally, such systems may be limited in their capabilities to detect/recognize symptoms indicative of an impending failure.

Thus, an improved system and method for monitoring a health status of a gradient coil disposed in an MRI system is generally desired.

BRIEF DESCRIPTION

In an embodiment, the present disclosure provides for a system for monitoring a health status of a gradient coil disposed in a magnetic resonance imaging system. The system includes one or more sensors and a controller. The one or more sensors are operative to obtain one or more parameter readings of the gradient coil, wherein the one or more parameter readings include at least one of an acoustic measurement and a back electromotive force measurement. The controller is in electronic communication with the one or more sensors and operative to generate the health status based on at least one of the acoustic measurement and the back electromotive force measurement.

In another embodiment, the present disclosure provides for a method for monitoring a health status of a gradient coil in a magnetic resonance imaging system. The method includes obtaining one or more parameter readings of the gradient coil via one or more sensors, wherein the one or more parameter readings include at least one of an acoustic measurement and a back electromotive force measurement. The method further includes generating, with a controller in electronic communication with the one or more sensors, the health status based on at least one of the acoustic measurement and the back electromotive force measurement.

In yet another embodiment, the present disclosure provides for a method of training a neural network. The method includes feeding a training dataset to the neural network. The training dataset includes a plurality of pairings each comprising of a parameter reading and a known health status of a gradient coil, wherein the parameter reading is at least one of an acoustic measurement and a back electromotive force measurement. The method further includes training the neural network in a supervised manner on the training dataset such that, for one or more of the pairings, the neural network generates a health status that substantially matches the known health status. The method further includes outputting, after the neural network has been trained, one or more weights of the neural network.

In yet another embodiment, the present disclosure provides for a system for monitoring a health status of a gradient coil. The system includes a sensor and a controller. The sensor is operative to obtain one or more parameter readings of the gradient coil. The controller is in electronic communication with the sensor and operative to generate the health status based at least in part on the one or more parameter readings.

DRAWINGS

Various aspects of this disclosure may be better understood upon reading the following detailed description and upon reference to the drawings in which.

Figure 1:
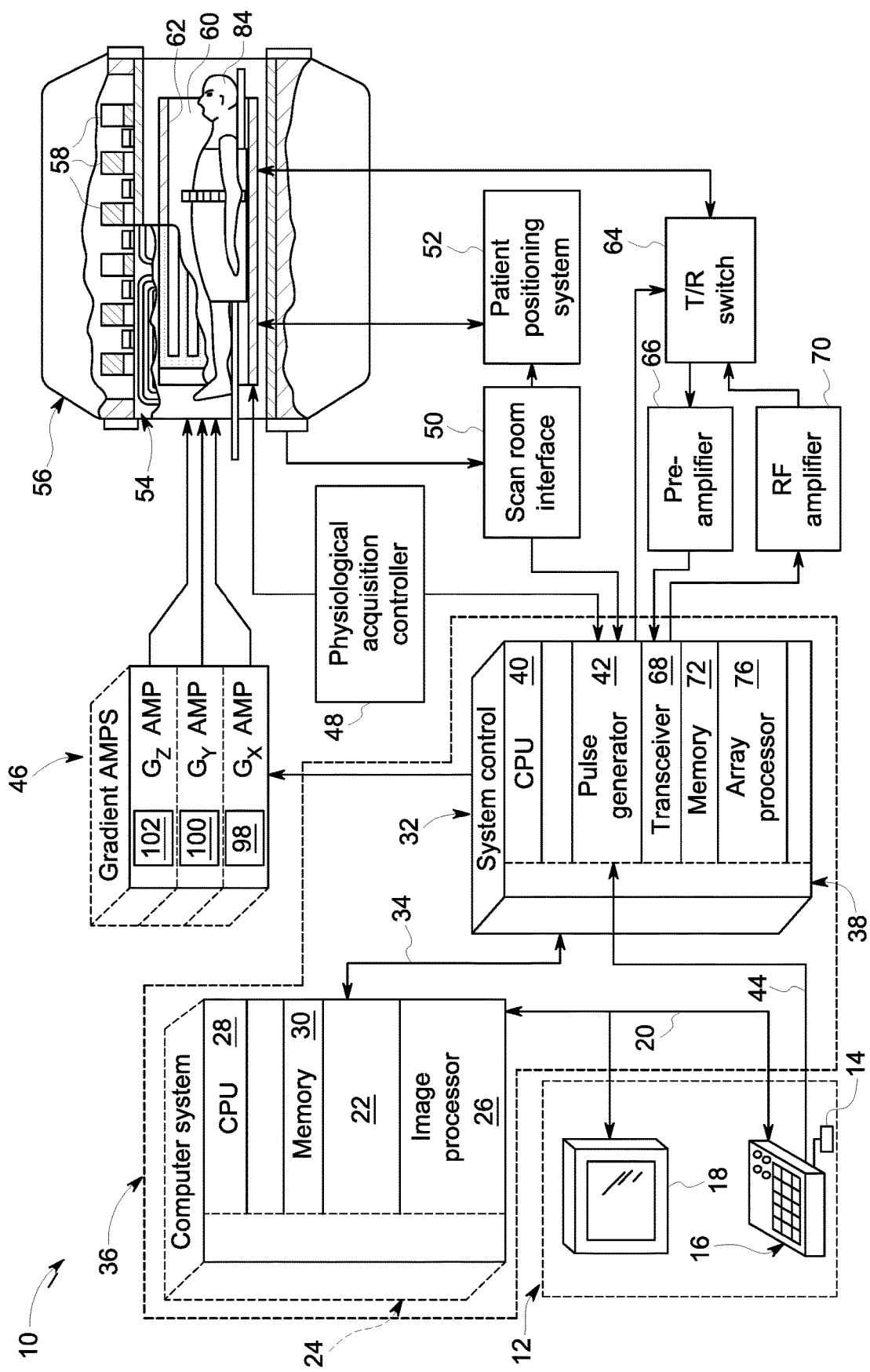
FIG. 1 is a block diagram of an MRI system that includes a system for monitoring a health status of a gradient coil, in accordance with an exemplary embodiment.

The drawings illustrate specific aspects of the described systems and methods for monitoring a health status of a gradient coil. Together with the following description, the drawings demonstrate and explain the principles of the structures, methods, and principles described herein. In the drawings, the size of the components may be exaggerated or otherwise modified for clarity. Well-known structures, materials, or operations may not be shown or described in detail to avoid obscuring aspects of the described components, systems, and methods.

DETAILED DESCRIPTION

One or more specific embodiments of the present disclosure are described below in order to provide a thorough understanding. These described embodiments are only examples of systems and methods for monitoring a health status of a gradient coil. Moreover, as will be understood, embodiments of the invention are not limited to neural networks and, accordingly, may include other forms of artificial intelligence. The skilled artisan will understand that specific details described in the embodiments can be modified when being placed into practice without deviating from the spirit of the present disclosure.

When introducing elements of various embodiments of the present disclosure, the articles "a," "an," and "the" are intended to mean that there are one or more of the elements. The terms "first," "second," and the like, do not denote any order, quantity, or importance, but rather are used to distinguish one element from another. The terms "comprising," "including," and "having" are intended to be inclusive and mean that there may be additional elements other than the listed elements. As the terms "connected to," "coupled to," etc. are used herein, one object (e.g., a material, element, structure, member, etc.) can be connected to or coupled to another object regardless of whether the one object is directly connected or coupled to the other object or whether there are one or more intervening objects between the one object and the other object. As used herein, "electrically coupled," "electrically connected," and "electrical communication" mean that the referenced elements are directly or indirectly connected such that an electrical current may flow from one to the other. The connection may include a direct conductive connection, i.e., without an intervening capacitive, inductive or active element, an inductive connection, a capacitive connection, and/or any other suitable electrical connection. Intervening components may be present.

In addition, it should be understood that references to "one embodiment" or "an embodiment" of the present disclosure are not intended to be interpreted as excluding the existence of additional embodiments that also incorporate the recited features. Further, the limitations of the following claims are not written in means-plus-function format and are not intended to be interpreted as such, unless and until such claim limitations expressly use the phrase "means for" followed by a statement of function void of further structure.

Further, it is to be understood that embodiments of the present invention may be applicable to Positron Emission Tomography ("PET")/MRIs and/or any other system having components susceptible to failure and/or degraded performance resulting from stresses incurred from use. For example, while the present invention is discussed herein as monitoring the health status of a gradient coil, it is to be understood that the systems and methods disclosed herein are equally applicable to other components in an MRI system, e.g., body coils, superconductive magnets, gradient amplifiers, etc.

Referring to the figures generally, the present disclosure is to provide systems and methods for monitoring a health status of a gradient coil disposed in a MRI system. In some embodiments, the systems and methods disclosed herein generate a health status of a gradient coil based on statistical deviation between one or more parameter readings of the gradient coil and the historical norms of the same parameters readings of gradient coils that have experienced little to no structural degradation. The term "parameter reading", as used herein with respect to a gradient coil, refers to a measurement of a physical and/or chemical characteristic/metric of a gradient coil The parameter readings may be of various metrics of a gradient coil such as acoustics, e.g., sound waves, back electromotive force ("back EMF") measurements, and/or other metrics related to the structural degradation of a gradient coil. As used herein, the terms "back electromotive force" and "back EMF" refer to a counter-electromotive force generated in a gradient coil after removal of an applied excitation current. The term "structural degradation", as used herein with respect to a gradient coil, refers to changes in the physical and/or chemical structure of the materials forming the gradient coil.

In some embodiments, the controller may generate the health status based on a pre-determined/known correlation/scale/model that maps/correlates one or more statistical differences/variances of gradient coil parameter readings from historical norms to known levels/amounts of gradient coil structural degradation. In embodiments, the correlation between statistical deviations in parameter readings and structural degradation may be determined in part by passing parameter readings obtained from one or more gradient coils to a neural network, i.e., the neural network may be trained on a historical dataset of parameter readings acquired from the gradient coils of multiple MRI systems. By analyzing a dataset of historical parameter readings, the neural network of some embodiments is able to provide an accurate indication of the health status of a gradient coil based on new parameter readings acquired from the gradient coil. Thus, in some embodiments, the controller may generate a health status for a gradient coil by passing/feeding parameter readings acquired from the gradient coil to a neural network. Additionally, in some embodiments, the controller and/or neural network is able to predict a time period during which the gradient coil may be expected to fail.

Now referring to FIG. 1, the major components of an MRI system 10 incorporating an exemplary embodiment of the invention are shown. Accordingly, operation of the system 10 is controlled from the operator console 12, which includes a keyboard or other input device 14, a control panel 16, and a display screen 18. The console 12 may communicate through a link 20 with a separate computer system 22 that enables an operator to control the production and display of images on the display screen 18. The computer system 22 may include a number of modules, which communicate with each other through a backplane 24. In embodiments, these include an image processor module 26, a CPU module 28, and a memory module 30, which may include a frame buffer for storing image data arrays. The computer system 22 may communicate with a separate system control or control unit 32 through a high-speed serial link 34. The input device 14 can include a mouse, joystick, keyboard, track ball, touch activated screen, light wand, voice control, or any similar or equivalent input device, and may be used for interactive geometry prescription. The computer system 22 and the MRI system control 32 collectively form an "MRI controller" 36.

In embodiments, the MRI system control 32 includes a set of modules connected together by a backplane 38. These include a CPU module 40 and a pulse generator module 42, which connects to the operator console 12 through a serial link 44. It is through link 44 that the system control 32 receives commands from the operator to indicate the scan sequence that is to be performed. The pulse generator module 42 operates the system components to execute the desired scan sequence and produces data which indicates the timing, strength and shape of the RF pulses produced, and the timing and length of the data acquisition window. The pulse generator module 42 connects to a set of gradient amplifiers 46, to indicate the timing and shape of the gradient pulses that are produced during the scan. The pulse generator module 42 can also receive patient data from a physiological acquisition controller 48 that receives signals from a number of different sensors connected to the patient, such as ECG signals from electrodes attached to the patient. And finally, the pulse generator module 42 connects to a scan room interface circuit 50, which receives signals from various sensors associated with the condition of the patient and the magnet system. It is also through the scan room interface circuit 50 that a patient positioning system 52 receives commands to move the patient to the desired position for the scan.

The pulse generator module 42 operates the gradient amplifiers 46 to achieve desired timing and shape of the gradient pulses that are produced during the scan. The gradient waveforms produced by the pulse generator module 42 are applied to the gradient amplifier system 46 having Gx, Gy, and Gz amplifiers. Each gradient amplifier excites a corresponding physical gradient coil in a gradient coil assembly, generally designated 54, to produce the magnetic field gradients used for spatially encoding acquired signals. The gradient coil assembly 54 forms part of a magnet assembly 56, which also includes a polarizing magnet 58 (which in operation, provides a homogenous longitudinal magnetic field $B_0$ throughout a target volume 60 that is enclosed by the magnet assembly 56) and a whole-body (transmit and receive) RF coil 62 (which, in operation, provides a transverse magnetic field $B_1$ that is generally perpendicular to $B_0$ throughout the target volume 60).

The resulting signals emitted by the excited nuclei in the patient may be sensed by the same RF coil 62 and coupled through the transmit/receive switch 64 to a preamplifier 66. The amplifier MR signals are demodulated, filtered, and digitized in the receiver section of a transceiver 68. The transmit/receive switch 64 is controlled by a signal from the pulse generator module 42 to electrically connect an RF amplifier 70 to the RF coil 62 during the transmit mode and to connect the preamplifier 66 to the RF coil 62 during the receive mode. The transmit/receive switch 64 can also enable a separate RF coil (for example, a surface coil) to be used in either transmit or receive mode.

The MR signals picked up by the RF coil 62 are digitized by the transceiver module 68 and transferred to a memory module 72 in the system control 32. A scan is complete when an array of raw K-Space data has been acquired in the memory module 72. This raw K-Space data/datum is rearranged into separate K-Space data arrays for each image to be reconstructed, and each of these is input to an array processor 76 which operates to Fourier transform the data into an array of image data. This image data is conveyed through the serial link 34 to the computer system 22 where it is stored in memory 30. In response to commands received from the operator console 12, this image data may be archived in long-term storage or it may be further processed by the image processor 26, conveyed to the operator console 12, and presented on the display 18.

Figure 2:
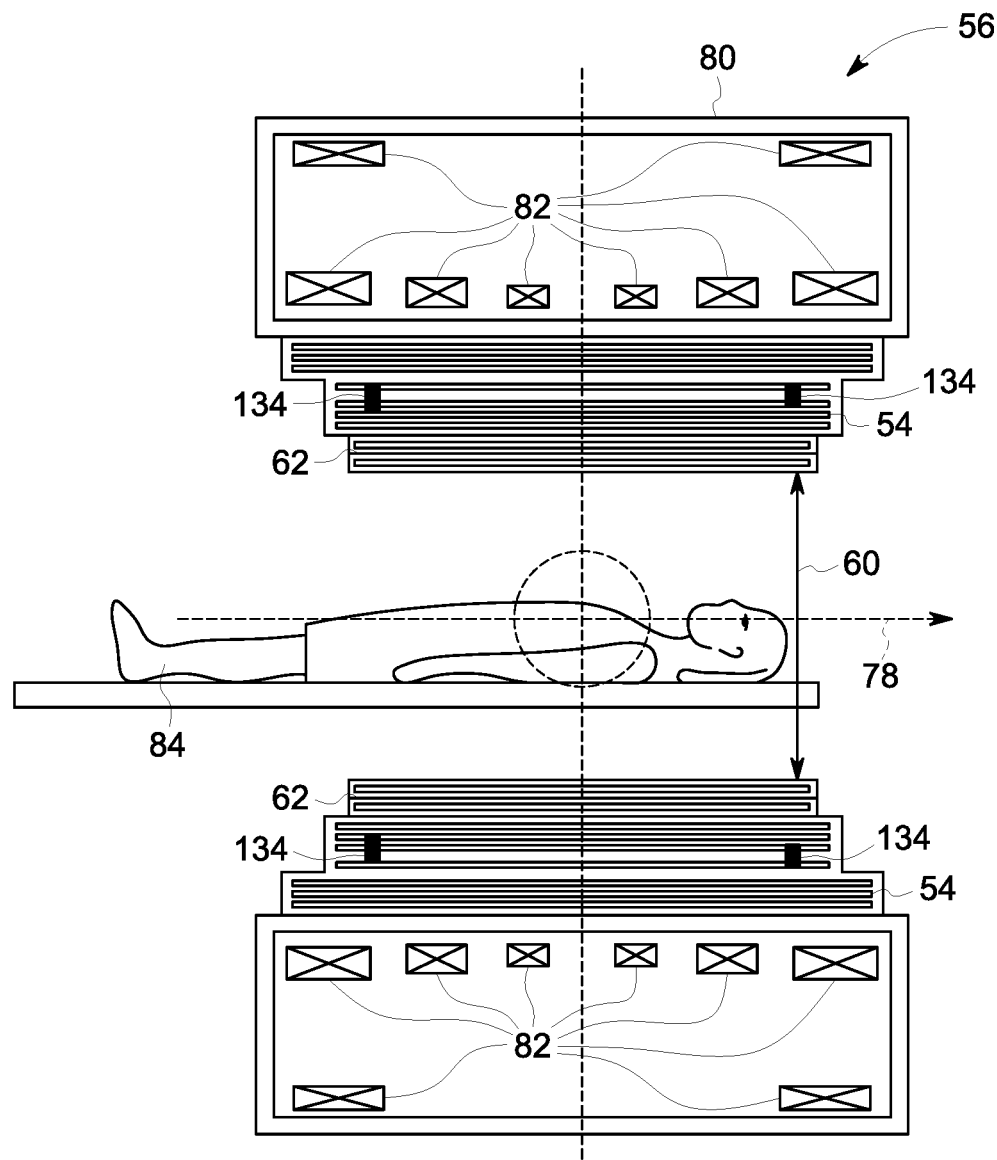
FIG. 2 is a schematic cross-sectional diagram of a magnet assembly of the MRI system of FIG. 1, in accordance with an exemplary embodiment.

As illustrated in FIG. 2, a schematic side elevation view of the magnet assembly 56 is shown in accordance with an embodiment of the invention. The magnet assembly 56 is cylindrical in shape having a center/central axis 78. The magnet assembly 56 includes a cryostat 80 and one or more radially aligned longitudinally spaced apart superconductive coils 82 that form the polarizing magnet 58 (FIG. 1). The superconductive coils 82 are capable of carrying large electrical currents and are designed to create the $B_0$ field within the patient/target volume 60. As will be appreciated, the magnet assembly 56 may further include both a terminal shield and a vacuum vessel (not shown) surrounding the cryostat 80 in order to help insulate the cryostat 80 from heat generated by the rest of the MRI system 10 (FIG. 1). The magnet assembly 56 may still further include other elements such as covers, supports, suspension members, end caps, brackets, etc. (not shown). While the embodiment of the magnet assembly 56 shown in FIGS. 1 and 2 utilizes a cylindrical topology, it should be understood that topologies other than cylindrical may be used. For example, a flat geometry in a split-open MRI system may also utilize embodiments of the invention described below. As further shown in FIG. 2, a patient/imaged subject 84 is inserted into the magnet assembly 56.

Figure 3:
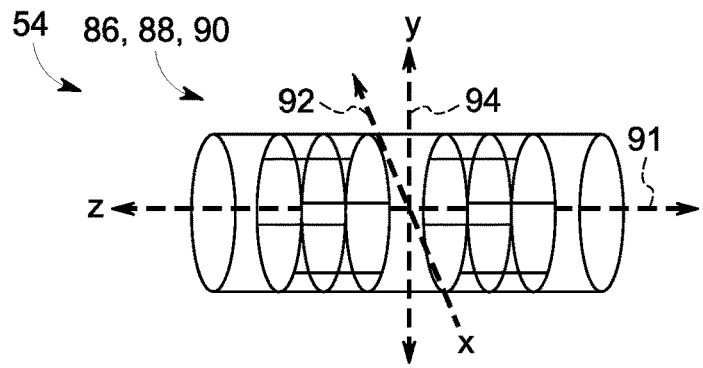
FIG. 3 is a diagram of a gradient coil assembly of the magnet assembly of FIG. 2, in accordance with an exemplary embodiment.

Illustrated in FIGS. 3-6 are various gradient coils 86, 88, and 90 of the gradient coil assembly 54 (FIG. 3). As will be understood, in embodiments, the gradient coil assembly 54 may include an x-gradient coil 86 (best seen in FIG. 4)

operative to generate/apply a gradient magnetic field along/corresponding to an x-axis 92, a y-gradient coil 88 (best seen in FIG. 5) operative to generate/apply a gradient magnetic field along/corresponding to a y-axis 94, and a z-gradient coil 90 (best seen in FIG. 6) operative to generate/apply a gradient magnetic field along/corresponding to a z-axis 91, which may be the same as the central axis 78 (FIG. 2) of the magnet assembly 56 (FIGS. 1 and 2). As will be appreciated, in addition to applying magnetic gradients oriented along the axes 91, 92, and 94, the gradient coils 86, 88, and 90 may be utilized to apply magnetic gradients along/corresponding to any direction within the space defined by the three axes 91, 92, and 94.

Figure 6:
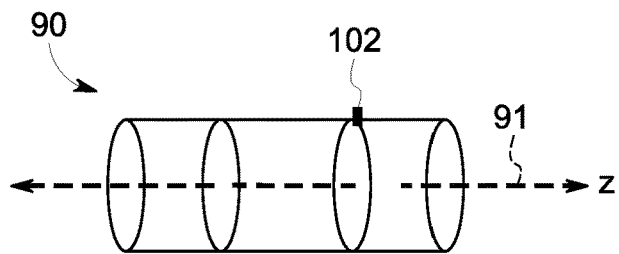
FIG. 6 is a diagram of a z-axis gradient coil of the gradient coil assembly of FIG. 3, in accordance with an exemplary embodiment.
Figure 7:
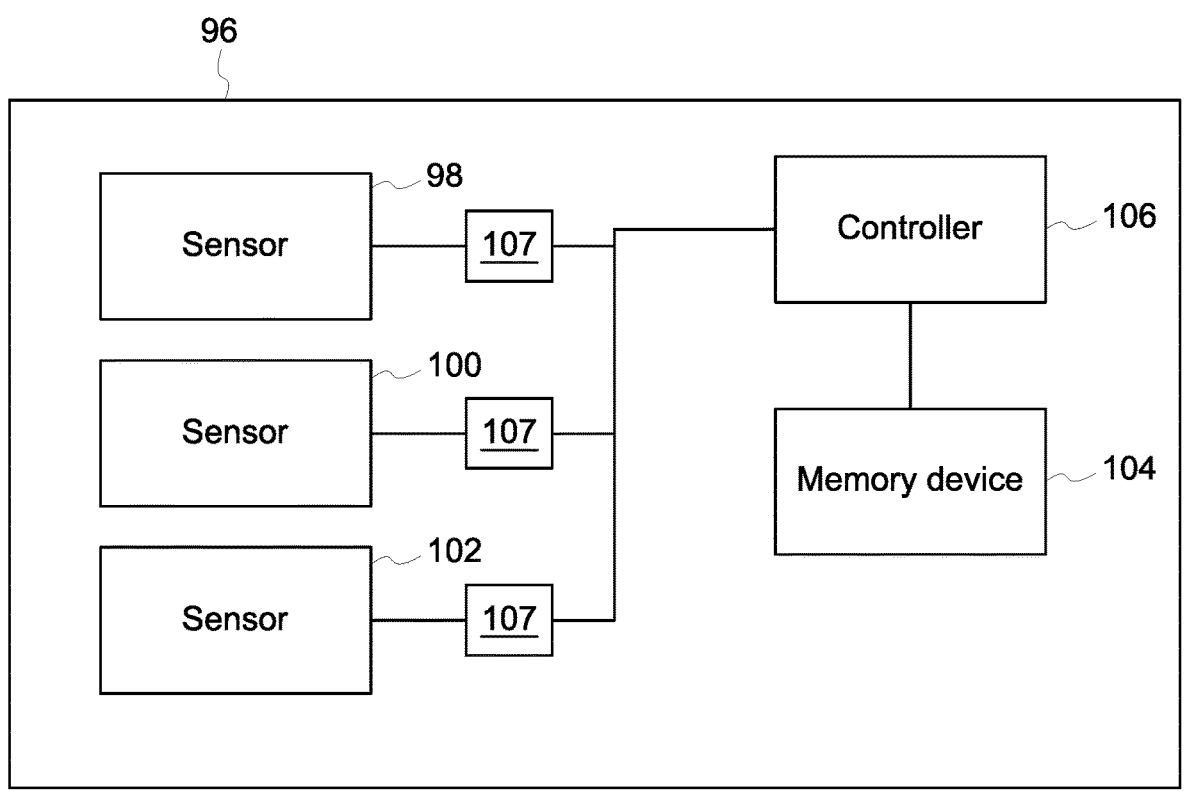
FIG. 7 is a block diagram of the system for monitoring a health status of a gradient coil disposed in the MRI system of FIG. 1, in accordance with an exemplary embodiment.

Turning to FIG. 7, a system 96 for monitoring a health status of a gradient coil 86, 88, and/or 90 (FIGS. 4-6) according to an exemplary embodiment of the invention is shown. The system 96, which, in embodiments, may be incorporated into the MRI system 10 (FIGS. 1 and 2), includes one or more sensors 98, 100, 102 (also shown in FIGS. 1 and 4-6), a memory device 104 (optionally), and a controller 106. The one or more sensors 98, 100, 102 are operative to obtain one or more parameter readings 107 of the gradient coil 86, 88, and/or 90, and the memory device 104 may store a neural network 108 (FIG. 12) and/or other types of models. Although three (3) sensors 98, 100, 102 are depicted in FIGS. 1 and 4-7, it will be understood that the invention is not limited to three (3) sensors and that embodiments may include fewer and or greater than three (3) sensors.

The controller 106 is in electronic communication with the one or more sensors 98, 100, 102, the memory device 104, and is operative/configured/adapted to generate a health status 110 (FIG. 14) that provides an indication of structural degradation of the gradient coil 86, 88, and/or 90. As will be understood, in embodiments, the memory device 104 may be separate from, or include, memory devices 30 and/or 72 (FIG. 1). Similarly, the controller 106 may be separate from, or include, controller 36 (FIG. 1).

Figure 4:
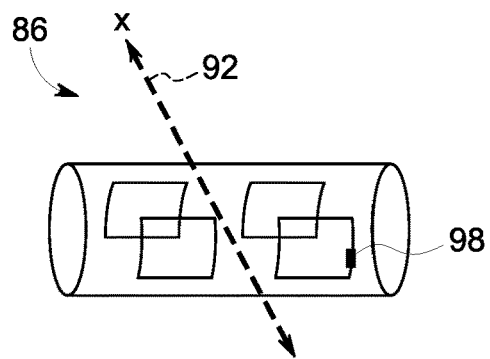
FIG. 4 is a diagram of an x-axis gradient coil of the gradient coil assembly of FIG. 3, in accordance with an exemplary embodiment.
Figure 5:
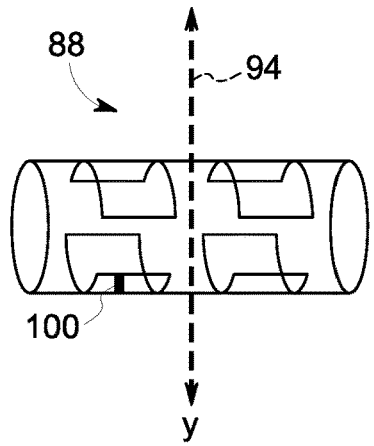
FIG. 5 is a diagram of a y-axis gradient coil of the gradient coil assembly of FIG. 3, in accordance with an exemplary embodiment.

As best seen in FIGS. 4-6, the one or more sensors 98, 100, 102 may be disposed proximate to, i.e., close, touching, and/or within, the gradient coil 86, 88, and/or 90. In embodiments, the obtained parameter readings 107 may include acoustic measurements and/or back EMF measurements.

For example, in certain embodiments, one or more of the sensors 98, 100, 102 may be a microphone, e.g., a condenser or optical microphone, that acquires acoustic measurements which may be of frequency, amplitude, or other sound-based metrics, generated by the gradient coil 86, 88, and/or 90. As will be understood, the acoustics of a gradient coil 86, 88, and/or 90 change as the level/amount of structural degradation of the coil 86, 88, and/or 90 changes. Thus, by mapping acoustics sampled from a gradient coil 86, 88, and/or 90 to known levels of structural degradation, embodiments of the present invention create a model, e.g., a neural network, that can be used to find the structural degradation of other gradient coils based on their acoustics.

Figure 8:
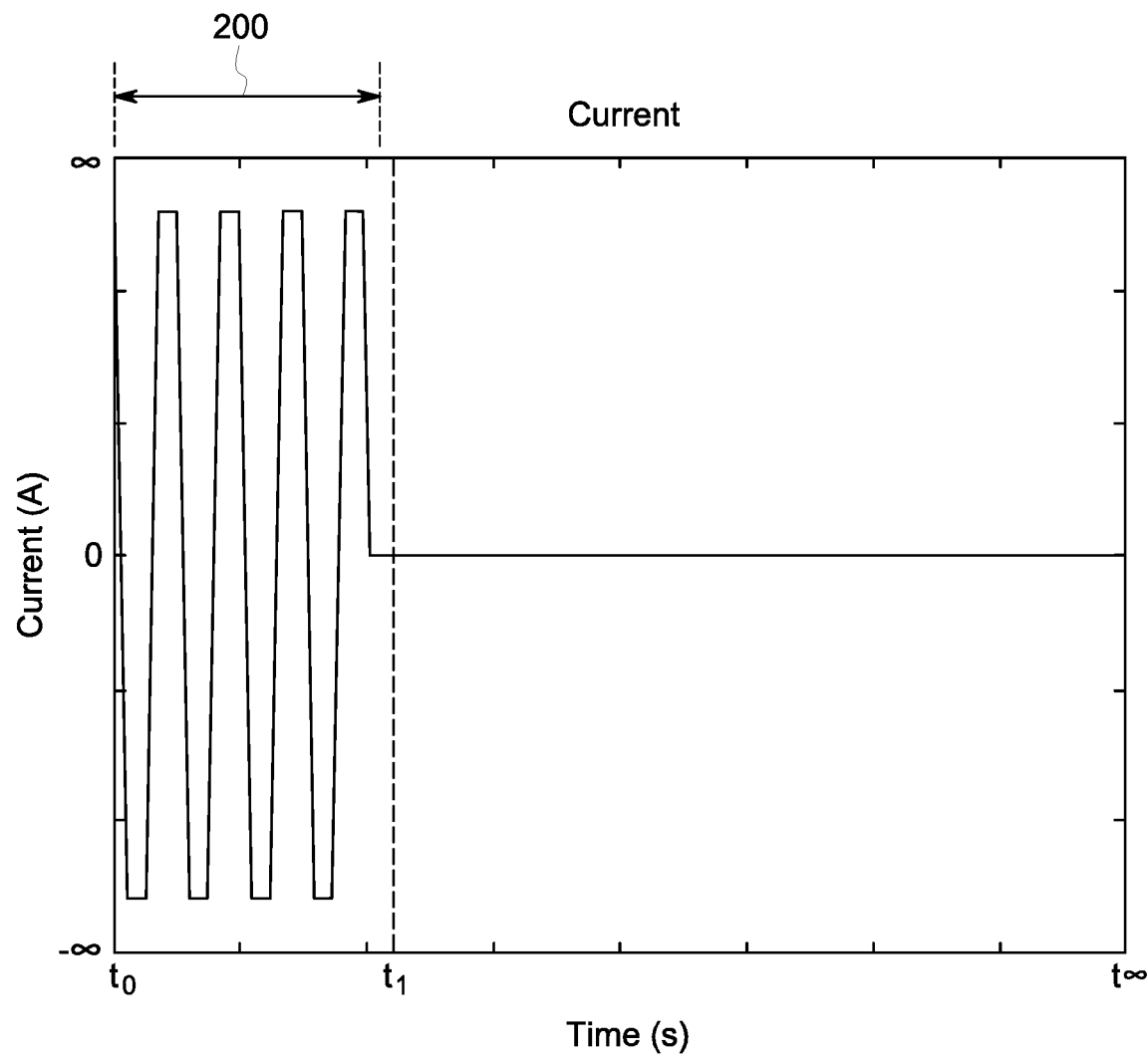
FIG. 8 is a chart depicting an excitation current applied to a gradient coil of the gradient coil assembly of FIG. 3, in accordance with an exemplary embodiment.
Figure 9:
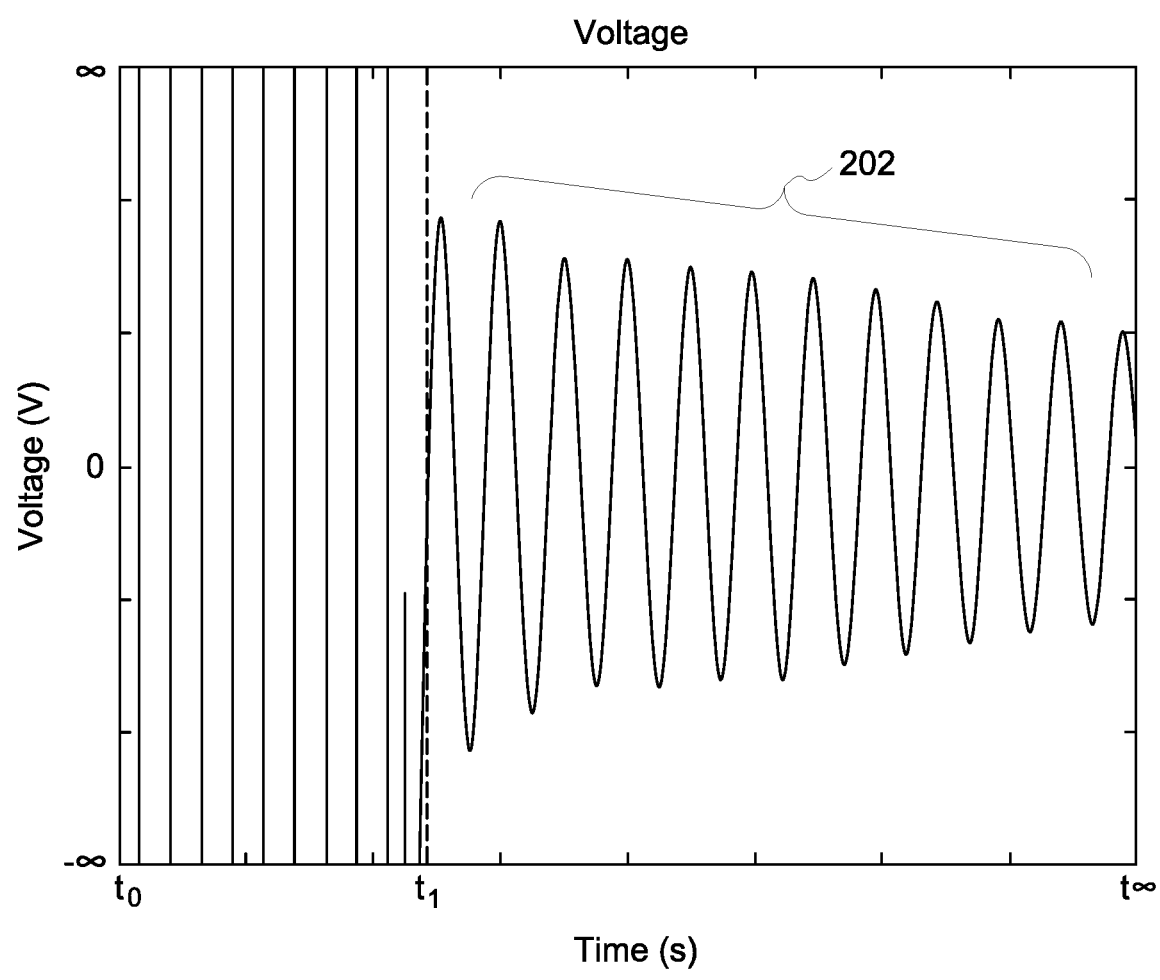
FIG. 9 is a chart depicting a back EMF voltage induced in the gradient coil after application of the excitation current of FIG. 8, in accordance with an exemplary embodiment.

Referring now to FIGS. 8 and 9, as stated above, in embodiments, the one or more sensors 98, 100, and 102 may obtain a back EMF measurement of a gradient coil 86, 88, and/or 90. As shown in FIGS. 8 and 9, in embodiments, a gradient amplifier 46 (FIG. 1) may apply and remove an excitation current 200 (FIG. 8) to a gradient coil 86, 88, and/or 90 (FIGS. 4-6), where the back EMF measurement is of a voltage 202 (FIG. 9), also referred to herein as a "back EMF voltage", induced by the movement of the gradient coil 86, 88, and/or 90 within the $B_0$ magnetic field. In embodiments, the excitation current 200 may be an AC current with the back EMF voltage 202 occurring due to the Lorentz force in gradient coil 86, 88, and/or 90 deformations, i.e., movement of the coil 86, 88, and/or 90 through the $B_0$ field lines, with the coil 86, 88, and/or 90 eventually settling back to equilibrium, i.e., no movement through the $B_0$ field lines. As will be understood, the greater the structural degradation of a gradient coil 86, 88, and/or 90, the greater the displacement/movement of the coil 86, 88, and/or 90 through the $B_0$ field lines, and, as a result, the greater the back EMF voltage 202 induced in the coil 86, 88, and/or 90. For example, as shown in FIGS. 8 and 9, the gradient amplifier 46 may apply an excitation current 200 for a period of time, e.g., $t_0$ to $t_1$, which, in turn, results in the back EMF voltage 202 being induced in a decaying manner after removal of the excitation current 200 at $t_1$, i.e., the oscillations of the sine wave of the voltage 202 decay/shrink over time as the coil 86, 88, and/or 90 returns back to equilibrium.

Figure 10:
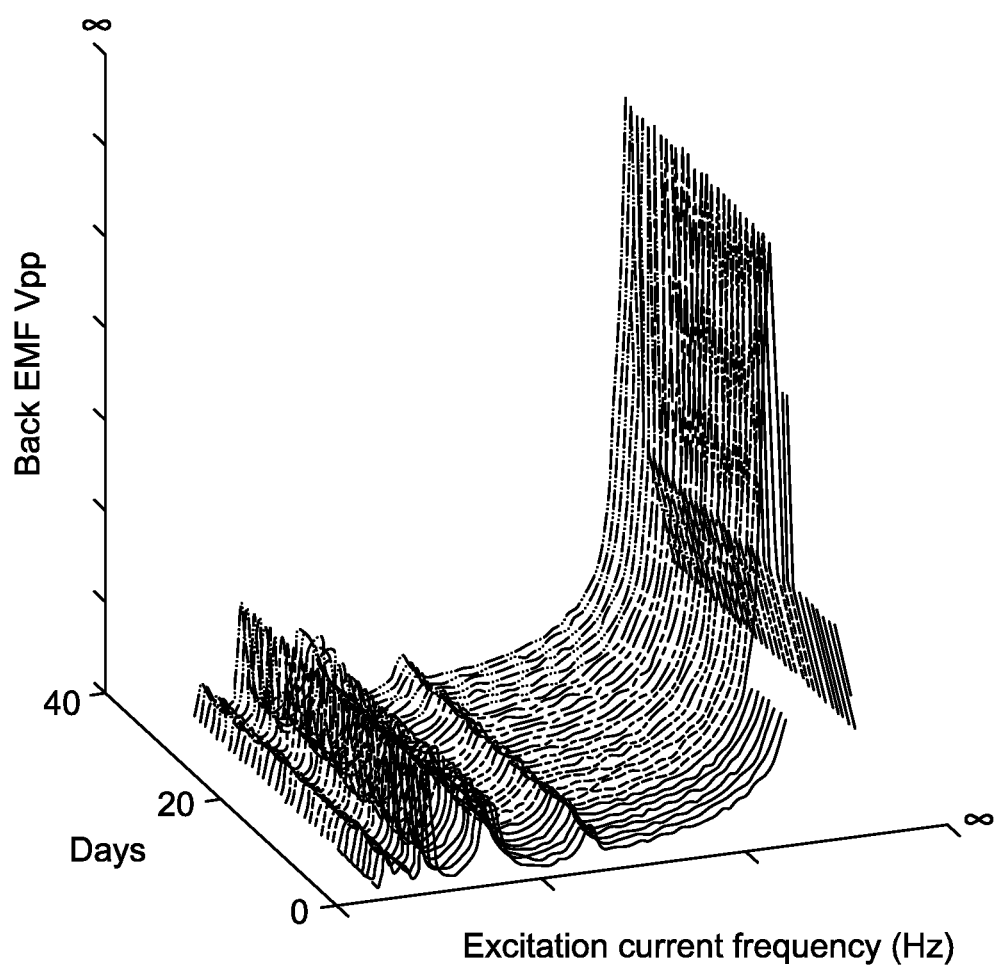
FIG. 10 is a chart depicting peak back EMF voltages induced in a gradient coil of the gradient coil assembly of FIG. 3 over a period of time for a plurality of excitation currents each having a different frequency, in accordance with an exemplary embodiment.
Figure 11:
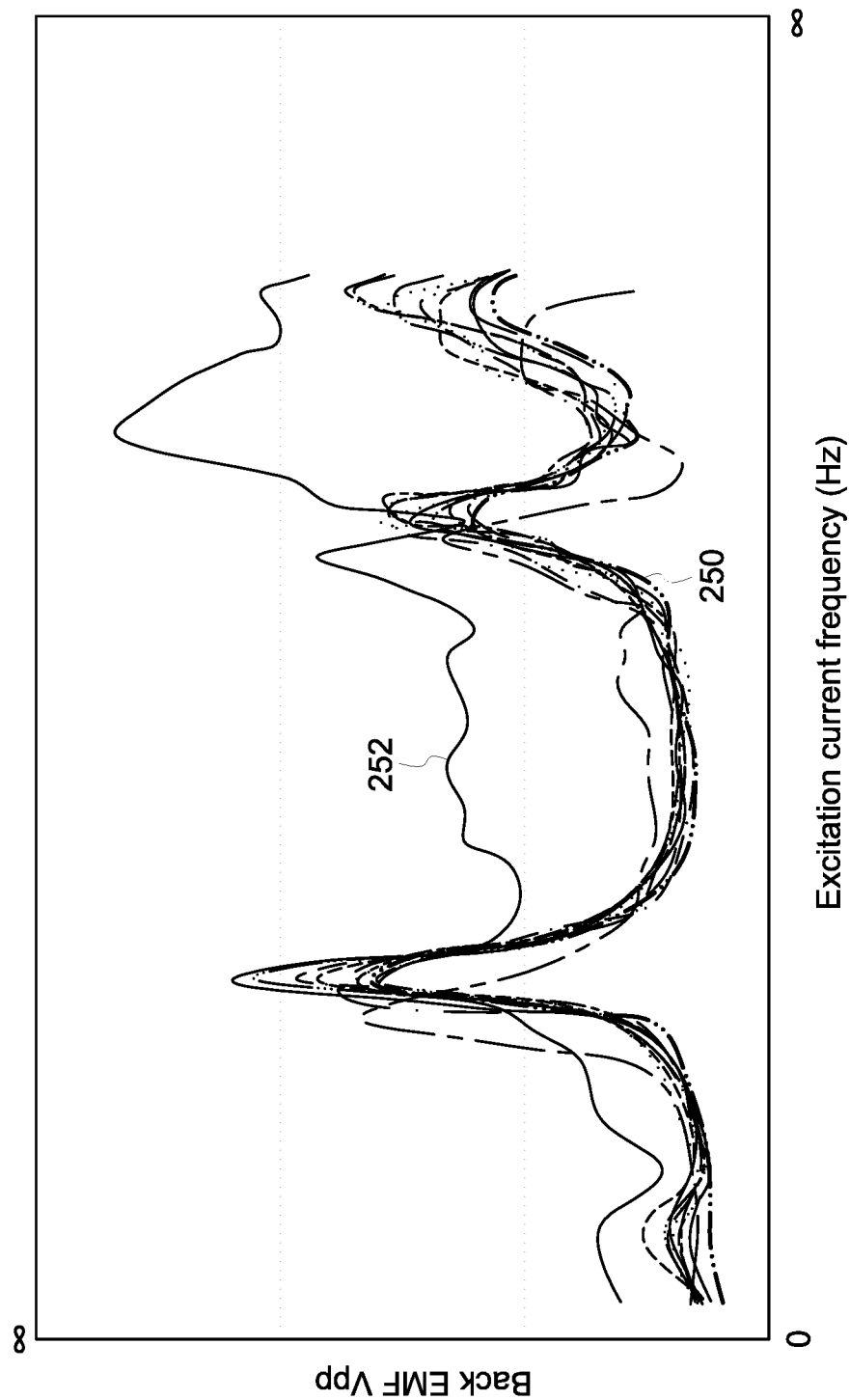
FIG. 11 is a chart depicting peak back EMF voltages of gradient coils of the gradient coil assembly of FIG. 3 for a plurality of excitation currents each having a different frequency, in accordance with an exemplary embodiment.

As illustrated in FIGS. 10 and 11, the peak voltage ("Vpp") of the back EMF voltage 202 of a gradient coil 86, 88, and/or 90 may be indicative of any experienced structural degradation. For example, FIG. 10 shows a plot of the peak voltage of a gradient coil 86, 88, and/or 90 measured at several frequencies over the course of one or more days, wherein the measurements of a particular day form a curve. As will be understood the shape of the curves (each formed by one or more peak voltage measurements over a plurality of frequencies during the same day) change overtime as the gradient coil 86, 88, and/or 90 experiences structural degradation.

Accordingly, FIG. 11 depicts a curve 250 for a gradient coil that has experienced little to no structural degradation, while curve 252 is of a gradient coil that has experienced structural degradation to the point of failure. Thus, as shown in FIG. 11, the back EMF voltage 252 of a gradient coil 86, 88, and/or 90 that has experienced a significant amount of structural degradation, i.e., a gradient coil that has failed or is about to fail, may exhibit a statistical deviation, at one or more excitation current frequencies, from the back EMF voltage 250 of a similar gradient coil 86, 88, and/or 90 that has experienced little to no structural degradation. As will be appreciated, embodiments of the present invention may determine whether a particular gradient coil 86, 88, and/or 90 has failed based at least in part on detected statistical deviations from historical norms and/or baseline data (for similar gradient coils) detected in the back EMF voltage of the gradient coil 86, 88, and/or 90. The range of the excitation current frequency and the range of the back EMF voltage may vary for different gradient coils (e.g., different designs, different manufacturers, etc.) and can be identified without undue experimentation.

Thus, in embodiments, the one or more sensors 98, 100, 102 may include a voltmeter that measures the back EMF voltage 202 in a gradient coil 86, 88, and/or 90. As will be appreciated, in embodiments, the voltmeter 98, 100, 102 may be disposed in one or more of the x, y, or z gradient amplifiers 46 as further shown in FIG. 1. Thus, in some embodiments, the sensors 98, 100, 102 may be voltmeters that measure the back EMF voltage of a gradient coil 86, 88, and/or 90 from the perspective of the gradient amplifiers 46.

While the foregoing paragraphs have discussed the one or more parameter readings 107 (FIGS. 7 and 17) as being either acoustics and/or back EMF measurements, it will be understood that, in embodiments, the obtained parameter readings 107 may include: impedance measurements; inductance measurements; resistance measurements; strain measurements; temperature measurements; acceleration measurements, e.g., the physical vibration of the gradient coil 86, 88, and/or 90; B₀ drift measurements; terminal block torque measurements, e.g., strain on the terminal blocks 134 (FIG. 2) which connect the gradient coil 86, 88, and/or 90 to power cables that supply the electrical power, e.g., the excitation current 200 (FIG. 8) that excites/energizes the coil 86, 88, and/or 90; and/or other metrics appropriate for determining the structural degradation of the gradient coil 86, 88, and/or 90. Accordingly, in such embodiments, the one or more sensors 98, 100, 102 may include resistance sensors, strain gauges, temperature probes, accelerometers, current meters, and/or other types of sensors suitable for measuring the aforementioned metrics.

Figure 12:
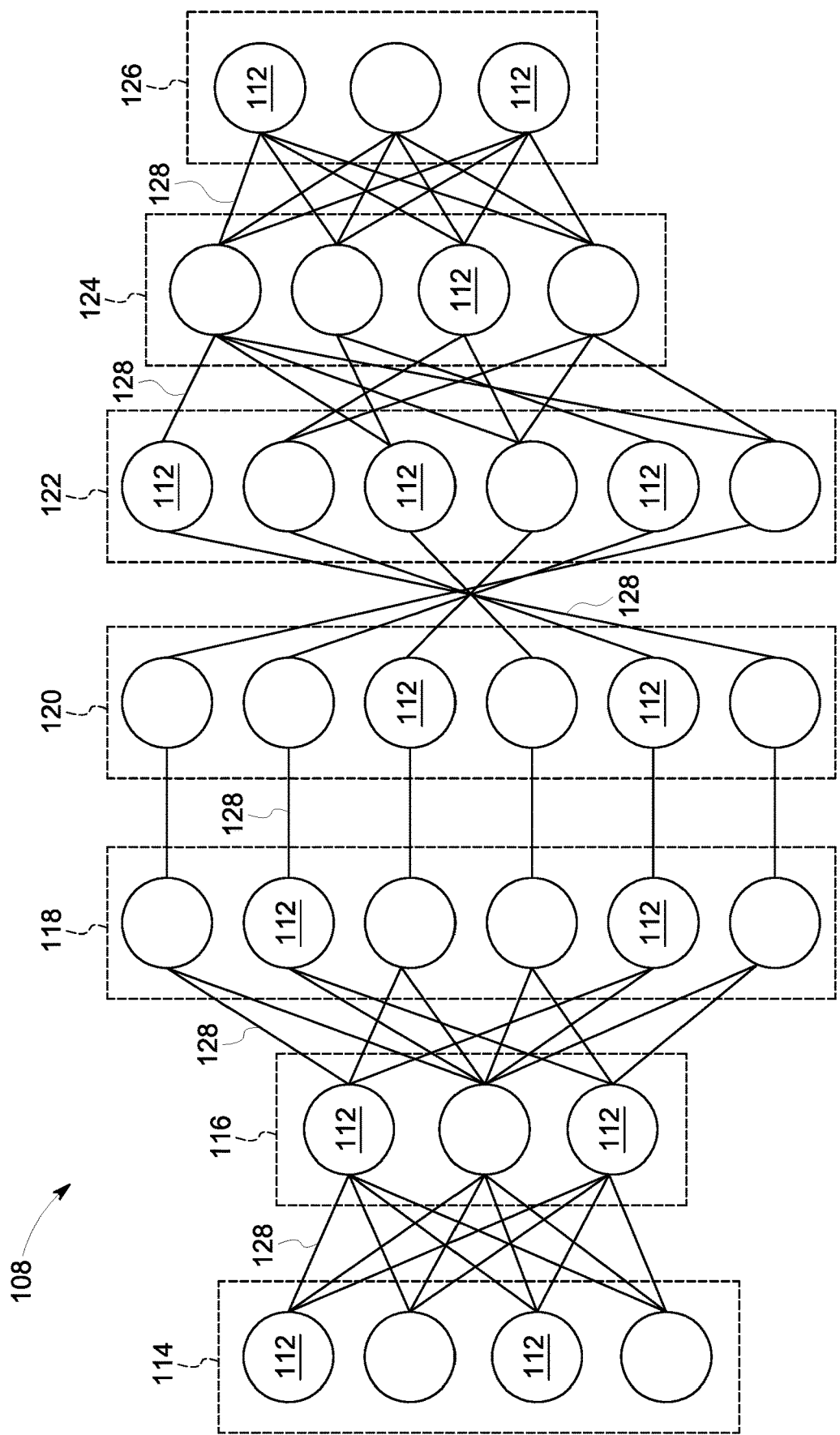
FIG. 12 is a block diagram of a neural network of the system of FIG. 7, in accordance with an exemplary embodiment.

Moving now to FIG. 12, in some embodiments, a neural network 108 is used for monitoring the health status of the gradient coil. The neural network 108 may include one or more nodes/neurons 112 which, in embodiments, may be disposed into one or more layers 114, 116, 118, 120, 122, 124, 126. As used herein with respect to a neural network, the term "layer" refers to a collection of simulated neurons that have inputs and/or outputs connected in similar fashion to other collections of simulated neurons. Accordingly, as shown in FIG. 12, the neurons 112 may be connected to each other via one or more connections 128 such that data, e.g., the parameter readings 107 (FIGS. 7 and 17) obtained from the one or more sensors 98, 100, 102 may propagate from an input layer 114, through one or more intermediate layers 116, 118, 120, 122, 124, to an output layer 126.

Figure 13:
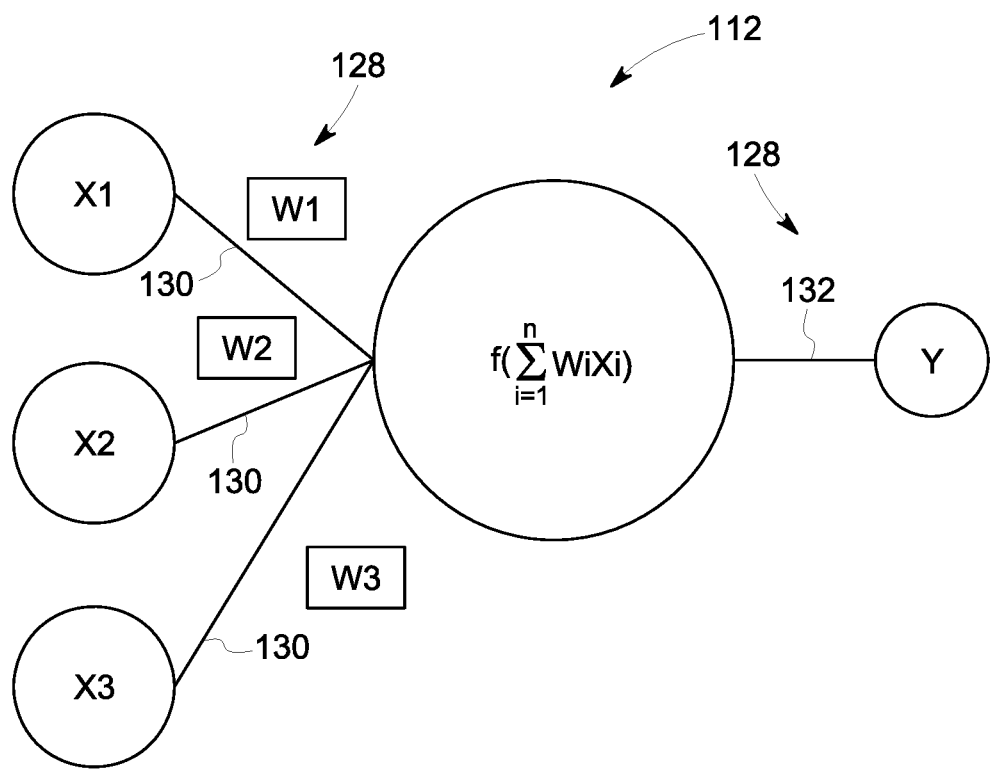
FIG. 13 is a block diagram of a neuron of the neural network of FIG. 12, in accordance with an exemplary embodiment.

As shown in FIG. 13, the connections 128 of an individual neuron 112 may include one or more input connections 130 and one or more output connections 132. Each input connection 130 of a neuron 112 may be an output connection of a preceding neuron, and the output connections 132 of the neuron 112 may be an input connection of one or more subsequent neurons. While FIG. 13 depicts a neuron 112 as having a single output connection 132, it will be understood that neurons may have multiple output connections that transmit/pass the same value. In embodiments, the neurons 112 may be data constructs, e.g., structures, instantiated class objects, matrices, etc., and the input connections 130 may be received by a neuron 112 as weighted numerical values, e.g., floating point or integer values. For example, as shown in FIG. 13, input connections X1, X2, and X3 may be weighted via weights W1, W2, and W3, respectively, summed, and sent/transmitted/passed as output connection Y. As will be appreciated, the processing of an individual neuron 112 may be represented, generally, by the equation:

$$Y = f\left(\sum_{i=1}^{n} WiXi\right)$$

where n is the total number of input connections 130 to the neuron 112. In embodiments, the value of Y may be based at least in part on whether the summation of WiXi exceeds a threshold. For example, Y may have a value of zero (0) if the summation of the weighted inputs fails to exceed a desired threshold.

Figure 14:
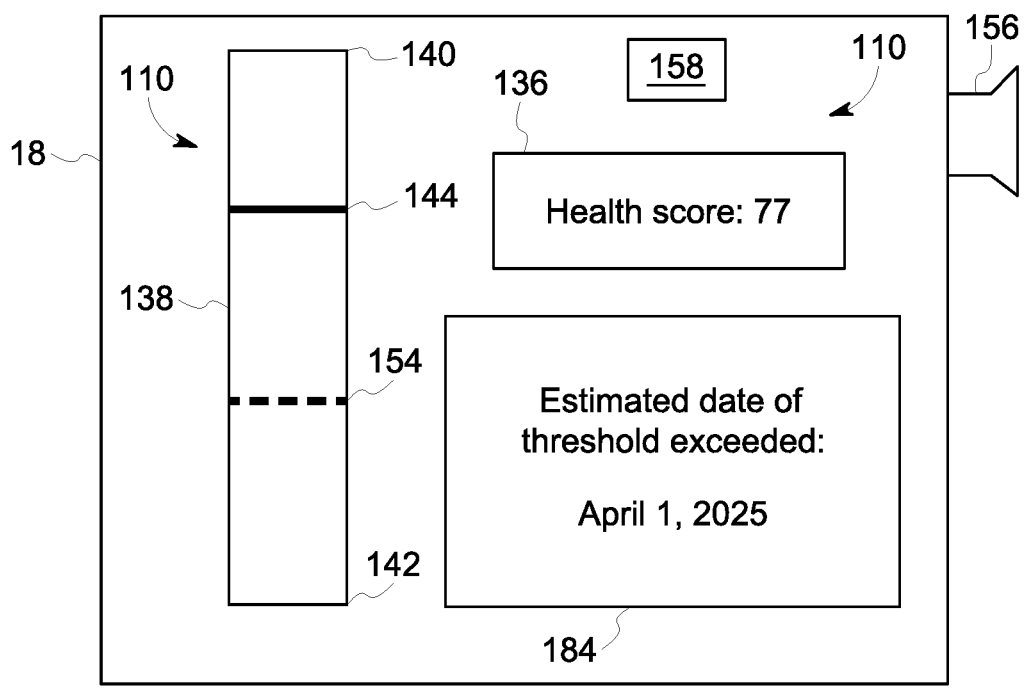
FIG. 14 is a diagram of the health status of the system of FIG. 7 as displayed on a monitor of the MRI system of FIG. 1, in accordance with an exemplary embodiment.

As will be further understood, the input connections 130 of neurons 112 in the input layer 114 (FIG. 12) may be mapped to the parameter readings 107 (FIGS. 7 and 17) obtained from the one or more sensors 98, 100, 102 (FIGS. 1 and 4-7), while the output connections 132 of the neurons 112 in the output layer 126 (FIG. 12) may be mapped to the health status 110 (FIG. 14). As used herein, "mapping" an input connection 130 to the parameter readings 107 refers to the manner by which the parameter readings 107 affect/dictate the value of the input connections 130. Similarly, as also used herein, "mapping" an output connection 132 to the health status 110 refers to the manner by which the value of the output connection 132 affects the health status 110. Accordingly, in embodiments, the parameter readings 107, or values derived therefrom, are passed/fed to the input layer 114 of the neutral network 112 and propagate through the layers 114, 116, 118, 120, 122, 124, 126 such that mapped output connections of the output layer 126 generates/corresponds to the health status 110.

For example, as shown in FIG. 14, the health status 110 may be a numerical score having a maximum and minimum value, e.g., a maximum value of one hundred (100) may indicate that the gradient coil 86, 88, and/or 90 has no detectable structural degradation, and a minimum value of zero (0) may indicate that the gradient coil 86, 88, and/or 90 has the maximum detectable structural degradation. As such, the health status 110 may be represented on the display 18 (also shown in FIG. 1) as a number (depicted by box 136), and/or via a scale 138 having a top 140 and bottom 142 respectively corresponding to the maximum and minimum score values and with a slidable bar 144 corresponding to the value of the health status 110.

Figure 15:
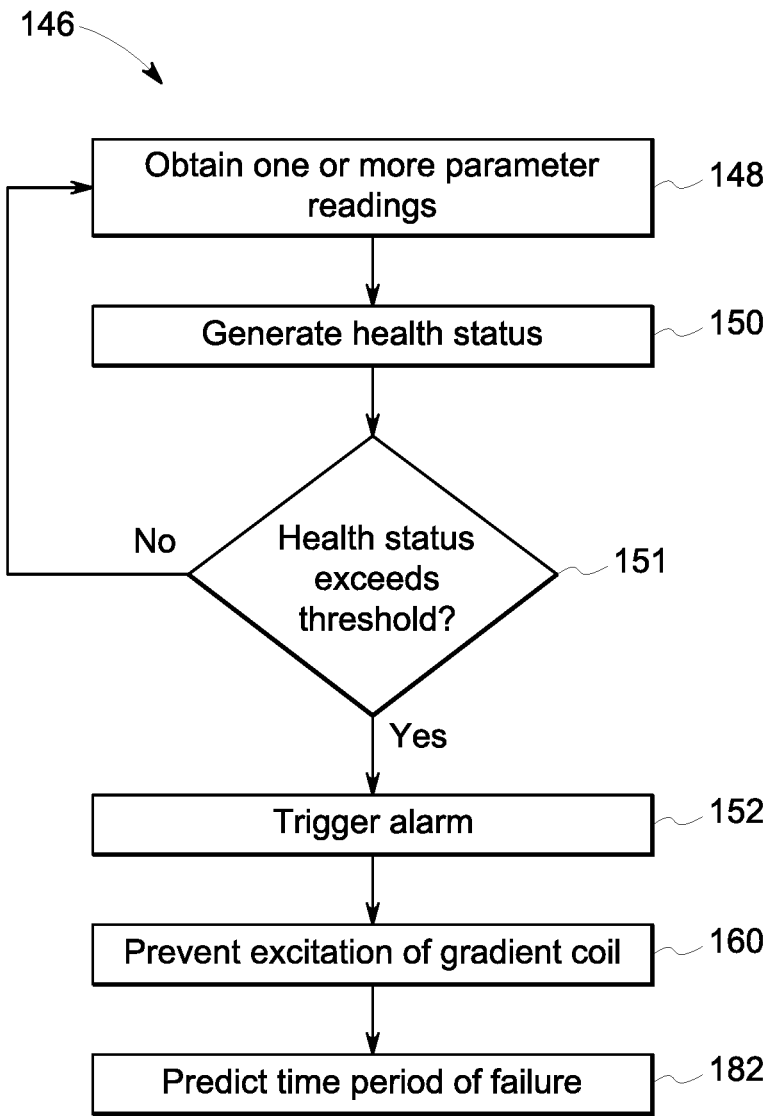
FIG. 15 is a flow chart of a method of monitoring a health status of a gradient coil disposed in the MRI system of FIG. 1 utilizing the system of FIG. 7, in accordance with an exemplary embodiment.

Turning to FIG. 15, a method 146 of monitoring the health status 110 (FIG. 14) via the system 96 (FIG. 7) according to an exemplary embodiment is shown. The method 146 includes obtaining, at step 148, the one or more parameter readings 107 (FIGS. 7 and 17) of the gradient coil 86, 88, and/or 90 (FIGS. 4-6) via the one or more sensors 98, 100, 102 (FIGS. 1 and 4-7); and generating, at step 150, the health status 110 (FIG. 14) via the neural network 108 (FIG. 12), or other model, based at least in part on the one or more parameter readings 107.

The method 146 may further include determining, at step 151, whether the generated health status 110 has exceeded a threshold 154 (FIG. 14), e.g., a lower threshold, and, optionally, triggering, at step 152, an alarm when the health status 110 (FIG. 14) exceeds the lower threshold 154. For example, in embodiments, the alarm may be an audio sound played through a speaker 156 (FIG. 14) and/or a visual cue 158 (FIG. 14) on the display 18. While the threshold 154 has been described above as a lower threshold, it will be understood that, in embodiments, the threshold 154 may be an upper threshold.

In embodiments, the method 146 may further include preventing, at step 160, via the controller 106 (FIG. 7), the excitation/energization/operation of the gradient coil 86, 88, and/or 90 when the health status 110 (FIG. 14) exceeds the lower threshold 154 (FIG. 14).

Figure 16:
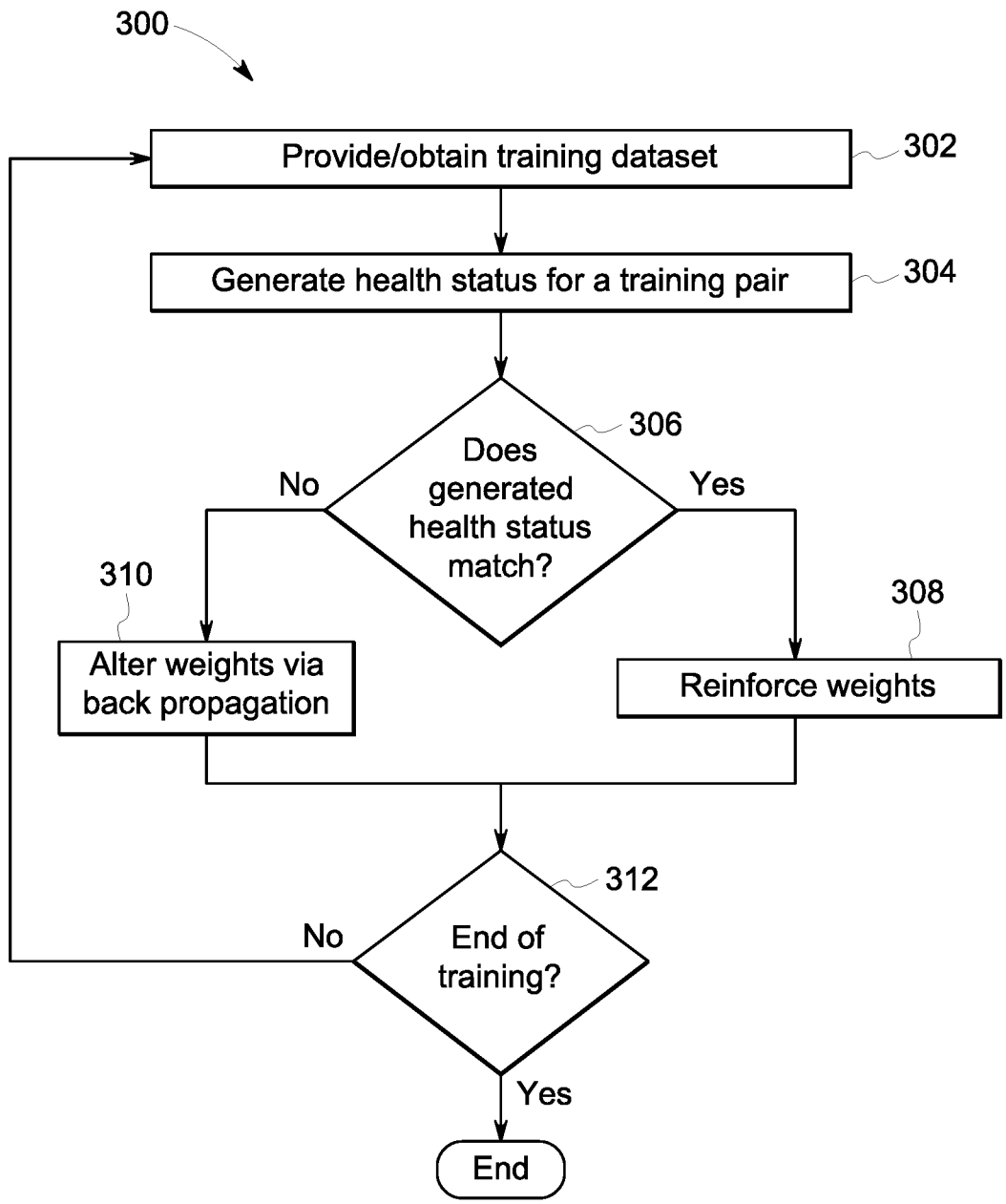
FIG. 16 is a flow chart depicting a method of training the neural network of FIG. 12, in accordance with an exemplary embodiment.

Embodiments of the present invention may also provide for methods of training the neural network 108 (FIG. 12). For example, shown in FIG. 16 is a method 300 of training the neural network 108 via supervised learning. As used herein, the term "supervised learning" refers to a process of training the weights of the neural network 108 with a dataset that has inputs with known outputs, e.g., a labeled training dataset. For example, in embodiments, the neural network 108 may be provided, at step 302, a labeled training dataset that includes one or more pairings of a parameter reading 107 (FIGS. 7 and 17) to a known health status 110 (FIG. 14), e.g., a set of recorded/acquired/sampled acoustic frequencies generated by the gradient coil 86, 88, and/or 90 paired to a corresponding set of known/expected health scores for each of the recorded/acquired/sampled acoustic frequencies. In embodiments, a health status may be generated via the neural network 108, at step 304, for each pairing within the training dataset, and compared, at step 306, to the known health status of the same pairing. The weights of the neural network 108 may then be reinforced, at step 308, or adjusted, at step 310, if the generated health status respectively matches or fails to match the known health status of the pairing. As represented by decision block 312, steps 304, 306, 308, and 310 may be repeated for all pairings in the training dataset multiple times until the accuracy of the neural network 108 reaches a sufficient level, e.g., the health status generated by the neural network 108 for a given parameter reading 107 in a pairing of the training dataset matches the known health status of the same paring ninety-nine percent (99%) of the time.

While the above paragraphs discuss training the neural network 108 via supervised methods, as will be appreciated, other methods of training the neural network 108 may be employed, e.g., unsupervised learning. As used herein, the term "unsupervised learning" refers to a process of training the weights of the neural network 108 without known outputs. For example, in such embodiments, the neural network 108 may be configured to train the weights so as to maximize a cost function.

Figure 17:
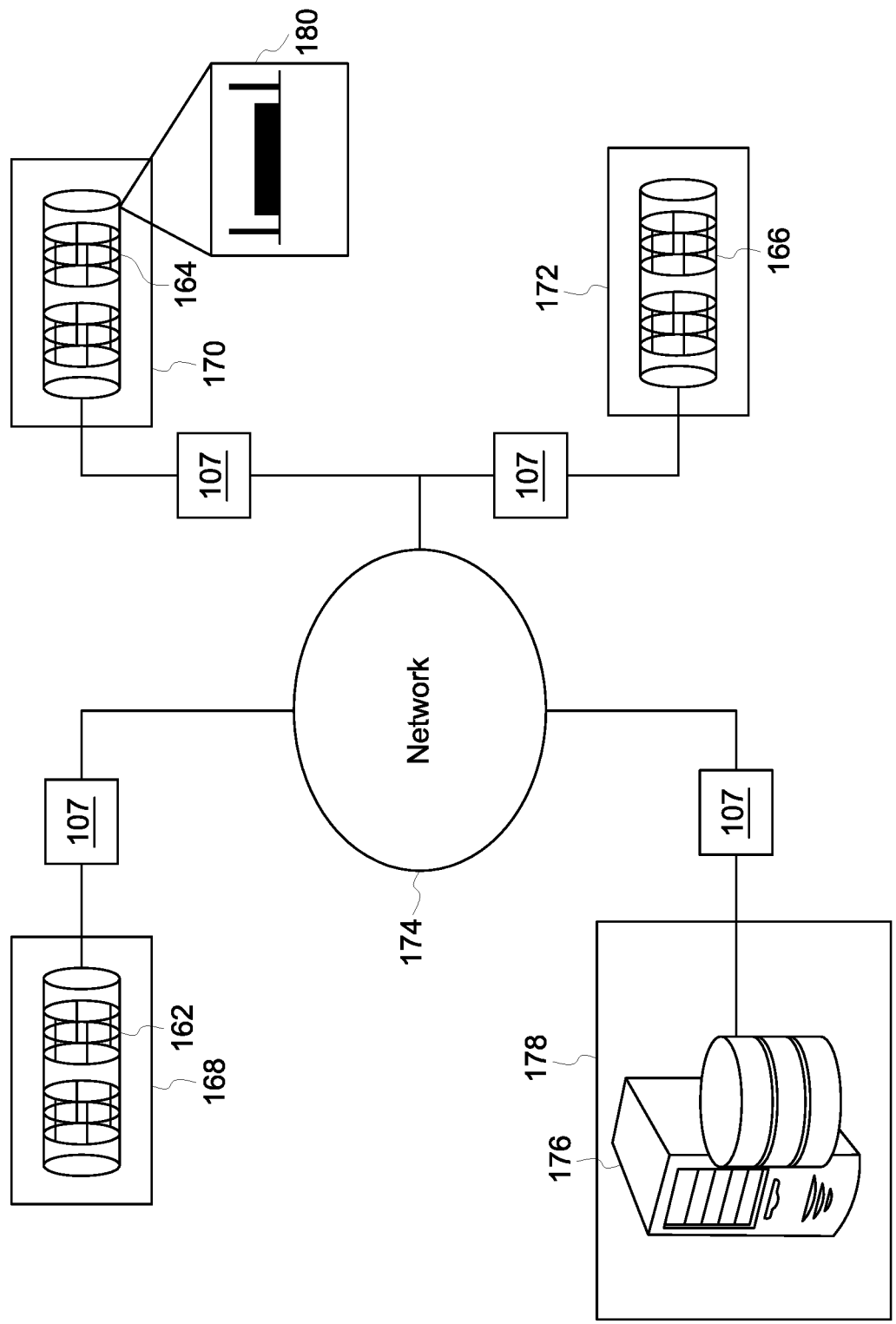
FIG. 17 is a block diagram depicting a server used to train the neural network of FIG. 12, wherein the server is networked to one or more MRI systems, in accordance with an exemplary embodiment.

Moving to FIG. 17, an instance of the neural network 108 (FIG. 12) may be trained on a dataset derived from a plurality of gradient coils, generally represented by 162, 164, 166, which may be disposed in different MRI systems, generally represented by 168, 170, 172, located at different operating facilities, e.g., hospitals and/or labs, across the world, connected via a network 174, e.g., the Internet, to a server 176 located at a separate site 178, e.g., a MRI research center and/or laboratory. As will be appreciated, each of the MRI systems 168, 170, 172 may include embodiments of the system 96 (FIG. 7) such that the training dataset may include parameter readings 107 (FIGS. 7 and 17) acquired from the gradient coils 162, 164, 166 via sensors as described above, and a corresponding list of the date/times of failures of the same gradient coils 162, 164, 166 and/or pulse sequences 180. The dataset may then be sent to, stored in, or otherwise accessible by the server 176. An instantiation of the neural network 108 may then be trained on the server 176 with the dataset in order to determine/discover relationships/symptoms within the acquired parameter readings 107 (FIGS. 7 and 17) indicative of gradient coil failures. As will be appreciated, the weights of the instantiated neural network trained on the server 176 may then be sent back to the system 96 in each of the MRI systems 168, 170, 172. In other words, the historical data, e.g., parameter readings 107 (FIGS. 7 and 17) obtained from the gradient coils 162, 164, 166 of multiple MRI systems 168, 170, 172 over a given duration of time, may be trended via the neural network 108 to detect/identify impending failures within the same, or similar, gradient coils 162, 164, 166.

For example, parameter readings 107 (FIGS. 7 and 17) may be obtained from the gradient coils 162, 164 of one or more MRI systems 168 and 170 at, or near, the time the MRI systems 168 and 170 come online, i.e., begin operational use, and stored as historical data in the server 176. The neural network 108 may then be trained to recognize typical ranges for a given parameter reading 107 that correspond to the beginning of a gradient coil life cycle, i.e., the time from first use of a gradient coil until failure. Over time, additional parameter readings 107 may be obtained from the gradient coils 162, 164 in the MRI systems 168 and 170 and stored in the server 176 so that the neural network 108 may be trained to recognize how a parameter reading 107 changes during the life cycle of a gradient coil, up to and/or including, failure of the gradient coil.

As will be appreciated, as new/younger MRI systems, e.g., MRI system 172, come online after the neural network 108 has had the opportunity to be trained on parameter readings 107 (FIGS. 7 and 17) encompassing a full life cycle of one or more gradient coils 162, 164 of the older MRI systems 168 and 170, the health status of the gradient coils 166 of the new/younger MRI systems 172 may be repeatedly generated at various points in their own life cycles via instances of the neural network 108 operating locally at the new systems 172 using training results/weights obtained/learned from the life cycles of the older gradient coils 162 and 164. For example, in such embodiments, the health status 110 may be a score that ranges from zero (0) to ten (10) where the neural network 108 generates/assigns a ten (10) for a gradient coil 166 in a new/younger MRI system 172 with parameter readings 107 (FIGS. 7 and 17) that are in accordance with historical norms for the particular point in the gradient coil's 166 life cycle, as understood/learned via the neural network 108 from training with the historical dataset/parameter readings 107 acquired from the gradient coils 162 and 164 of the older MRI systems 168 and 170.

As will be understood, in such embodiments, the neural network 108 may generate progressively lower scores corresponding to the amount that the parameter readings 107 of the gradient coil 166 in the new/younger MRI system 172 deviate from the historical norms, with zero (0) being the maximum amount of detectable deviation. In other words, in such embodiments, a health status/score 110 (FIG. 10) of ten (10) indicates that the gradient coil 166 is aging, i.e., incurring structural degradation, as expected based on historical norms, where a health status/score of zero (0) indicates that the gradient coil 166 is aging faster than expected based on historical norms. In such embodiments, the lower threshold 154 (FIG. 14) may be a score of five (5), which may indicate that the gradient coil should be replaced, and/or that corrective action should be taken to mitigate/reduce the risk of failure, e.g., a reduction in the temperature acceleration of the gradient coil during future operational cycles and/or the use of software interlocks to block-out excitation frequencies that may increase structural degradation.

Additionally, in embodiments, the neural network 108 may provide for a correlation between gradient coil acceleration, i.e., physical vibrations, and/or acoustics, and gradient coil failure; and similarly, for a correlation between inductance-and-resistance ("LR") and back EMF and gradient coil failure.

As will be appreciated, while the above described training scenario concerned parameter readings 107 (FIGS. 7 and 17) obtained from multiple MRI systems 168 and 170, it will be understood that, in embodiments, the dataset used to train the weights of the neural network 108 may be derived from a single gradient coil 86, 88, and/or 90 of a single MRI system 168.

Referring back to FIG. 15, in embodiments, the method 146 may further include predicting, at step 182, a time period 184 (FIG. 14) when the health status 110 (FIG. 14) will exceed the lower threshold 154 (FIG. 14). For example, the neural network 108 may be trained as disclosed above such that the neural network 108 is able to accurately predict, based on the acquired parameter readings 107 (FIGS. 7 and 17), a future time/date that the gradient coil 86, 88, and/or 90 will have sustained structural degradation sufficient to warrant repair and/or replacement of the gradient coil 86, 88, and/or 90. The time period 184 may be displayed on the monitor 18 (as shown in FIG. 14) in various formats, e.g., weeks, years, days, hours, minutes, seconds, standard date formats, and/or any other format capable of conveying the amount of time remaining until the health status 110 exceeds the lower threshold 154.

Finally, it is also to be understood that the systems 10 and/or 96 may include the necessary electronics, software, memory, storage, databases, firmware, logic/state machines, microprocessors, communication links, displays or other visual or audio user interfaces, printing devices, and any other input/output interfaces to perform the functions described herein and/or to achieve the results described herein. For example, as previously mentioned, the systems 10 and/or 96 may include at least one processor and system memory/data storage structures, which may include random access memory (RAM) and read-only memory (ROM). The at least one processor of the systems 10 and/or 96 may include one or more conventional microprocessors and one or more supplementary co-processors such as math co-processors or the like. The data storage structures discussed herein may include an appropriate combination of magnetic, optical and/or semiconductor memory, and may include, for example, RAM, ROM, flash drive, an optical disc such as a compact disc and/or a hard disk or drive.

Additionally, a software application that adapts a controller to perform the methods disclosed herein may be read into a main memory of the at least one processor from a computer readable medium, e.g., a medium that provides or participates in providing instructions to the at least one processor of the systems 10 and/or 96 (or any other processor of a device described herein) for execution. Such a medium may take many forms, including but not limited to, non-volatile media and volatile media.

While in embodiments, the execution of sequences of instructions in the software application causes at least one processor to perform the methods/processes described herein, hard-wired circuitry may be used in place of, or in combination with, software instructions for implementation of the methods/processes of the present invention. Therefore, embodiments of the present invention are not limited to any specific combination of hardware and/or software.

It is further to be understood that the above description is intended to be illustrative, and not restrictive. For example, the above-described embodiments (and/or aspects thereof) may be used in combination with each other. Additionally, many modifications may be made to adapt a particular situation or material to the teachings of the invention without departing from its scope.

Accordingly, by providing automated monitoring of a health status of a gradient coil, some embodiments of the present invention may reduce the risk of the gradient coil failing during an MRI scan without the need to manually inspect the gradient coil. As will be appreciated, such embodiments may improve the patient throughput of an MRI system by avoiding the need to rescan a patient due to a failed gradient coil, as well as reducing and/or avoiding down time of an MRI system incurred during manual inspection of the gradient coils.

Further, by predicting a time period during which a gradient coil is expected to fail, some embodiments of the present invention may provide for improved patient throughput over traditional MRI systems by facilitating improved coordination between scheduling patient scans and MRI system down time due to gradient coil maintenance/replacement. In other words, some embodiments of the present invention provide for proactive maintenance of gradient coils, as opposed reactively detecting an already failed gradient coil. In such embodiments, proactive maintenance of gradient coils may improve patient safety/comfort by reducing the risk that a patient will be exposed to excessive gradient coil noise/vibrations.

Further still, by using the gradient amplifiers of an MRI system to obtain back EMF parameter readings, some embodiments of the present invention provide for a system of monitoring the health status of a gradient coil that makes use of existing sensors/equipment presently found in many MRI systems. Thus, such embodiments of the present invention provide for improved monitoring of the health status of a gradient coil without incurring the significant costs typically associated with developing and/or installing new types of sensors into existing MRI systems already in use at various locations.

Yet further still, by storing and analyzing historical dataset/parameter readings, of gradient coils in multiple MRI systems, in a server, some embodiments of the invention may provide for improved understanding of future gradient coil failures. For example, in such embodiments, analysis of the historical data of the acceleration history of a failed gradient coil by the neural network may facilitate faster identification of the root cause of the failure.

In addition to any previously indicated modification, numerous other variations and alternative arrangements may be devised by those skilled in the art without departing from the spirit and scope of this invention, and the appended claims are intended to cover such modifications and arrangements. Thus, while the invention has been described above with particularity and detail in connection with what is presently deemed to be the most practical and preferred aspects, it will be apparent to those of ordinary skill in the art that numerous modifications, including, but not limited to, form, function, manner of operations, and/or use may be made without departing from the principles and concepts set forth herein.

Finally, the examples and embodiments used herein are meant to be illustrative only and should not be construed to be limiting in any manner.

What is claimed is:

1. A system for monitoring a health status of a gradient coil disposed in a magnetic resonance imaging system, the system comprising:
   one or more sensors operative to obtain a parameter reading of the gradient coil, wherein the parameter reading includes at least one of an acoustic measurement and a back electromotive force measurement; and
   a controller in electronic communication with the one or more sensors and operative to:
   feed a training dataset to a neural network, wherein the training dataset includes a plurality of pairings each comprising of the parameter reading and a known health status of the gradient coil;
   train the neural network in a supervised manner on the training dataset such that, for one or more of the pairings, the neural network generates the health status that substantially matches the known health status.

2. A method for monitoring a health status of a gradient coil in a magnetic resonance imaging system, the method comprising:
   obtaining a parameter reading of the gradient coil via one or more sensors, wherein the parameter reading includes at least one of an acoustic measurement and a back electromotive force measurement;
   feeding a training dataset to a neural network, wherein the training dataset includes a plurality of pairings each comprising of the parameter reading and a known health status of the gradient coil;

training the neural network in a supervised manner on the training dataset such that, for one or more of the pairings, the neural network generates the health status that substantially matches the known health status; and outputting one or more weights of the neural network after the neural network has been trained.

3. The system of claim 1, wherein the controller is further operative to trigger an alarm when the health status exceeds a threshold.

4. The system of claim 1, wherein the controller is further operative to prevent excitation of the gradient coil when the health status exceeds a threshold.

5. The system of claim 1, wherein the one or more sensors include a microphone disposed proximate to the gradient coil and operative to obtain the acoustic measurement.

6. The system of claim 1, wherein the one or more sensors includes a voltmeter operative to obtain the back electromotive force measurement.

7. The system of claim 6, wherein the voltmeter is disposed within a gradient amplifier that drives the gradient coil.

8. The system of claim 7, wherein the controller is operative to obtain the back electromotive force measurement via the voltmeter after the gradient amplifier has removed an excitation current from the gradient coil.

9. The system of claim 1, wherein the the parameter reading further includes at least one of an impedance measurement, an inductance measurement, a resistance measurement, a strain measurement, a temperature measurement, an acceleration measurement, a B0 drift measurement, and a terminal block torque measurement.

10. The system of claim 1, wherein the controller is further operative to predict a time period when the health status will exceed a threshold.

11. The system of claim 1, wherein the neural network is trained on a dataset that corresponds to one or more pulse sequences of one or more magnetic resonance imaging systems.

12. The method of claim 2 further comprising:
triggering, via the controller, an alarm when the health status exceeds a threshold.

13. The method of claim 2 further comprising:
preventing, via the controller, excitation of the gradient coil when the health status exceeds a threshold.

14. The method of claim 2, wherein obtaining the parameter reading of the gradient coil via one or more sensors comprises:
obtaining the acoustic measurement via a microphone disposed proximate to the gradient coil.

15. The method of claim 2, wherein obtaining the parameter reading of the gradient coil via one or more sensors comprises:
obtaining the back electromotive force measurement via a voltmeter disposed in a gradient amplifier that drives the gradient coil.

16. The method of claim 2 further comprising:
predicting, via the controller, a time period when the health status will exceed a threshold.

17. A method of training a neural network, the method comprising:
feeding a training dataset to the neural network, wherein the training dataset includes a plurality of pairings each comprising of a parameter reading and a known health status of a gradient coil, wherein the parameter reading is at least one of an acoustic measurement and a back electromotive force measurement;
training the neural network in a supervised manner on the training dataset such that, for one or more of the pairings, the neural network generates a health status that substantially matches the known health status; and
outputting, after the neural network has been trained, one or more weights of the neural network.

* * * * *